United States Patent [19]
Bour et al.

[11] Patent Number: 5,396,508
[45] Date of Patent: Mar. 7, 1995

[54] POLARIZATION SWITCHABLE QUANTUM WELL LASER

[75] Inventors: David P. Bour, Spring Court Cupertino; Thomas L. Paoli, Los Altos; David W. Treat, San Jose, all of Calif.

[73] Assignee: Xerox Corporation, Stamford, Conn.

[21] Appl. No.: 948,522

[22] Filed: Sep. 22, 1992

[51] Int. Cl.$^6$ .................. H01S 3/18; H01S 3/102
[52] U.S. Cl. ......................... 372/27; 372/45; 372/50
[58] Field of Search ............. 372/26, 27, 45, 50, 372/46, 8

[56] References Cited

U.S. PATENT DOCUMENTS

| | | | |
|---|---|---|---|
| 4,612,645 | 9/1986 | Liu et al. | 372/45 |
| 4,918,701 | 4/1990 | Amann et al. | 372/27 |
| 5,007,063 | 4/1991 | Kahen | 372/45 |
| 5,012,474 | 4/1991 | White et al. | 372/27 |
| 5,048,040 | 9/1991 | Paoli | 372/50 |
| 5,079,774 | 1/1992 | Mendez et al. | 372/27 |
| 5,117,469 | 5/1992 | Cheung et al. | 385/11 |

OTHER PUBLICATIONS

S. R. Chinn, P. S. Zory, and A. R. Resinger, IEEE Jour Quantum Electronics 24, 2191–2214 (No. 11, Nov. 1988).

P. J. A. Thijs, L. F. Theimeijer, P. I. Kuindersma, J. J. M. Binsma, and T. van Dongen, IEEE Jour, Quantum Electronics 27, 1426–1439 (1991). Jun.

L. F. Teimeijer, P. J. A. Thijs, P. J. de Waard, J. J. M. Binsma, and T. van Dongen, Appl. Phys. Lett. 58, 2738–2740 (1991). Jun.

M. J. B. Boermans, S. H. Hagen, A. Valster, Mn. N. Finke, and J. M. M. van der Heyden, Electronics Lett. 26, 1438–1439 (1990). Aug.

D. F. Welch, T. Wang, and D. R. Scifres, Electronics Lett. 27, 693–695 (1991). Apr.

M. Kondo, K. Domen, C. Anayama, T. Tanahashi, and K. Nakajima, Jour. Crystal Growth 107, 578–582 (1991). No month available.

S. H. Pan, H. Shen, Z. Hang, F. H. Pollak, W. Zhuang, Q. Xu, A. P. Roth, R. A. Masut, C. Lacelle, and D. Morris, Phys. Rev. B-38, 3375–3382 (1988). Aug.

S. W. Corzine and L. A. Caldren, Appl. Phys. Lett., 59, 588–590 (1991), Jul.

H. C. Casey, Jr. and M. B. Panish, Heterostructure Lasers Part A: Fundamental Principles, Academic Press Orlando, Fla. (1978) pp. 79–82. No month available.

"GaInAsP Alloy Semiconductors", T. P. Pearsall, ed. John Wirley & Sons, N.Y. (1982) pp. 61–106. No month available.

H. C. Casey, Jr. & M. B. Panish, "Heterostructure Lasers Part B: Materials & Operating Characteristics", Academic Press, Orlando, Fla. (1978) pp. 132–148. No month available.

Primary Examiner—Rodney B. Bovernick
Assistant Examiner—Robert McNutt
Attorney, Agent, or Firm—Rosen, Dainow & Jacobs

[57] ABSTRACT

A QW diode laser whose polarization can be switched. In one embodiment, the device incorporates a tensile strained quantum well active region, whose thickness is adjusted so that the heavy hole and light hole band edges are of the same energy. Since the heavy hole transition provides TE-mode gain, while the light hole band provides mostly TM-mode gain, the resulting laser polarization will be very sensitive to the threshold carrier density. With an intracavity loss modulator in such a structure, the polarization could be switched. Other switching techniques are also described.

29 Claims, 7 Drawing Sheets

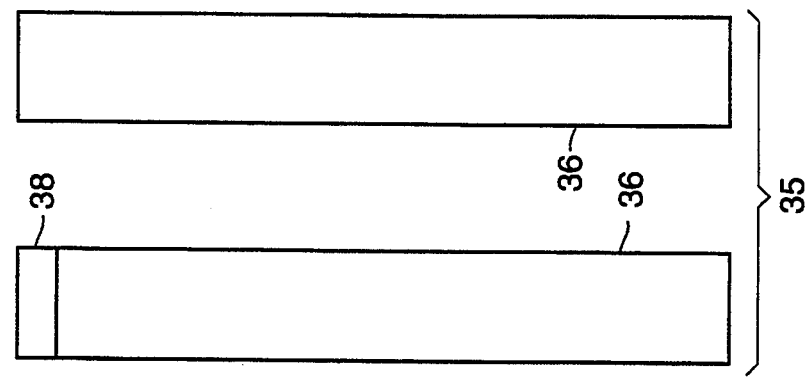
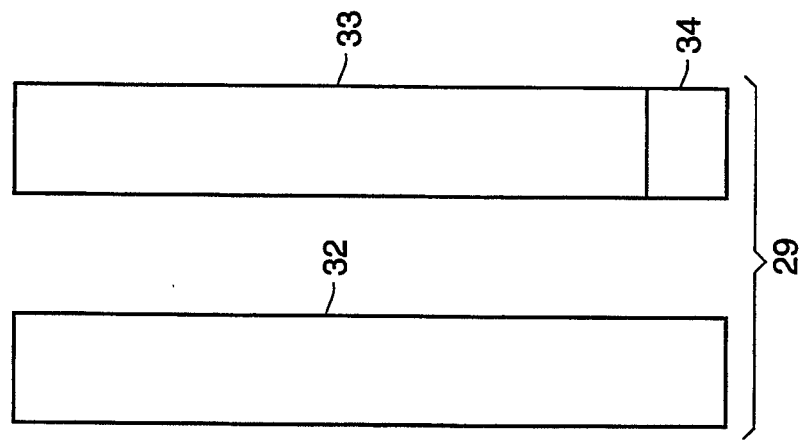
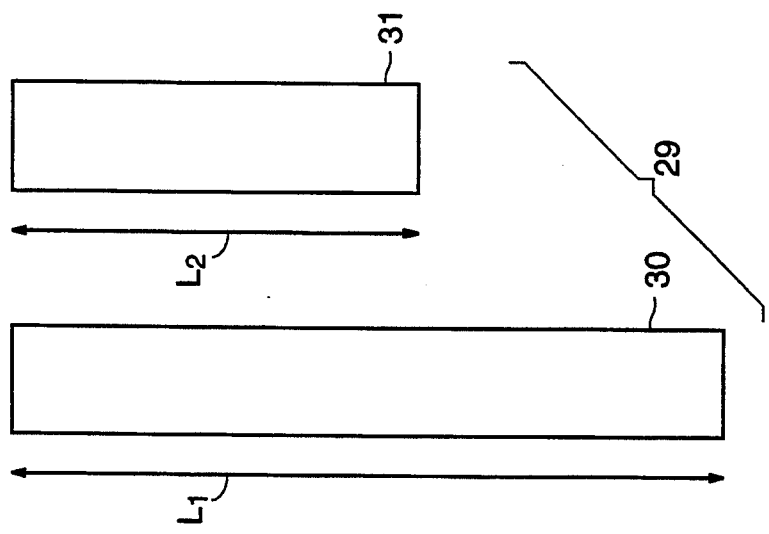

POLARIZATION SWITCHABLE QUANTUM WELL LASER

RELATED APPLICATIONS (1) Commonly-assigned, concurrently-filed application, Ser. No. 07/948,531, filed Sep. 22, 1992, patented Aug. 30, 1994, Pat. No. 5,343,224, entitled "Diode Laser Multiple Output Scanning System" (D/91293-IP/902080), in the name of Thomas L. Paoli.

(2) Commonly-assigned, concurrently-filed application, Ser. No. 07/948,524, filed Sep. 22, 1992, entitled "Multi-beam, Orthogonally-polarized Emitting Monolithic Quantum Well Lasers" (IP 912502) (XRX-125).

(3) Commonly-assigned, concurrently-filed application, Ser. No. 07/812,238, filed Dec. 19, 1991, patented Sep. 7, 1993, Pat. No. 5,243,359, entitled "A Raster Output Scanner for a Single Pass Printing System which Separates Plural Laser Beams by Wavelength and Polarization" in the names of James J. Appel and Thomas L. Paoli.

This invention relates to a semiconductor quantum well laser, and, in particular, to a quantum well laser capable of differently polarized gains.

BACKGROUND OF THE INVENTION

Quantum well (QW) lasers normally oscillate in the transverse electric (TE) polarization, rather than the transverse magnetic (TM) mode. In a QW laser, the TE-mode gain arises from the heavy hole transition, while the TM-mode gain is provided by the light hole transitions. Normally these lasers oscillate in the TE-mode because the $n=1$ heavy hole is the lowest energy state, and therefore it is the state whose population is most easily inverted. This is true for both unstrained GaAs and compressively strained InGaAs/AlGaAs and InGaAs/InGaAsP/InP QW lasers. The heavy hole is lowest in energy because the quantum shifts are inversely proportional to the effective mass; therefore the light hole levels are shifted to higher energies than the heavy hole levels. Additionally, in compressively strained InGaAs/AlGaAs and InGaAs/InGaAsP lasers, the strain leads to an even greater difference between these levels.

Transitions involving the heavy hole band have a 3:0 asymmetry for TE:TM mode gain, while those involving the light hole levels have a 1:4 asymmetry for TE:TM mode gain. Such a gain anisotropy does not occur in double heterostructure (DH) lasers, which have a bulk-like active region.

The first related application, Ser. No. 07/948,531, whose contents are hereby incorporated by reference, discloses the implementation of monolithic, multiple beam laser diode sources for use in multistation Xerographic processors with single optics. The devices in this implementation could produce laser beams with two nearly orthogonal polarizations. A quad beam laser diode device implemented with this concept would permit considerable simplification in a four-beam optical system through the use of beam separation by polarization at two wavelengths. The quad beam laser device is achieved by appropriate orientation of closely spaced laser chips within a single integrated package, or by the relative orientation of the linearly polarized beams emitted by a monolithic laser array. Such monolithic arrays are obtained, for example, by combining the multiple wavelength techniques disclosed in U.S. Pat. No. 5,048,040 issued to Paoli with the multiple polarization techniques disclosed herein.

SUMMARY OF THE INVENTION

An object of the invention is a polarization-controllable QW semiconductor laser.

A further object of the invention is a QW semiconductor laser having one or more substantially identical active regions, with each region emitting a beam having either one of two orthogonal polarizations.

Another object of the invention is a QW semiconductor laser having an active region associated with means for selectively operating the active region in either its TE or TM polarization mode.

In accordance with an aspect of the present invention, we have discovered that the polarization gain of a QW laser can be selected by a user or by electronic means, specifically, the active portion of the semiconductor laser can be caused to selectively emit TE or TM polarized emissions. This is based upon the following observation that in a situation where the light hole and heavy hole band edges are reversed, such as can occur in a tensile-strained active region, the resulting polarization is TM. This has been observed in tensile strained InGaAsP/InP QWs and in both bulk and QW devices in the GaInP/AlGaInP/GaAs material systems. Thus, in a device where the light-hole and heavy-hole bands are substantially coincident in energy, sometimes referred to as degeneracy, the polarization of the emission will be a sensitive function of the threshold carrier density (which determines the degree to which the individual band populations are inverted), and other factors such as temperature, facet reflectivity, cavity length and intracavity optical loss.

Taking advantage of this aspect of the invention, a device structure can be constructed which allows either polarization to be selected, or switched in special cases. This is accomplished in a preferred embodiment with a tensile-strained QW, whose thickness is adjusted so that the LH and HH band edges line up exactly. While a GaInP/AlGaInP QW structure is used as an example, this concept could also be applied to other material systems where tensile-strained Qws are possible, for example GaAsP/AlGaAs, and InGaAs/InGaAsP/InP.

In accordance with another aspect of the invention, a QW diode laser is provided whose direction of polarization can be switched substantially 90 degrees by changing the threshold carrier density. The device incorporates an active region which is a tensile-strained quantum well or multiple Qws whose thickness is adjusted so that the heavy hole and light hole band edges are of nearly the same energy. As an example, the laser action could be started using the heavy hole transition, which is the dominant gain TE mode. By raising the threshold carrier density the device can be switched to operate on the light hole transition, for TM mode-emission, which is orthogonally polarized to the TE mode.

In accordance with still another aspect of the invention, the threshold carrier density is varied by selectively introducing loss into the structure. Various ways are available to do this, for example, by changing the current drive to a modulator, or by changing the temperature of the laser active region, or by changing the reflectivity of the reflectors associated with the laser active region. In all the methods described in this specification for selecting or switching a device to a desired polarization, no electric field is applied to the active QW layer or layers.

The device of the invention offers a number of advantages. An important benefit is the construction of closely spaced multiple beam diode sources in a common substrate for various applications needing adjacent beams with orthogonal polarizations. For example, a printer with monolithic, two beam diode laser. Important also is that the differently polarized beams are generated from a single semiconductor active body, or multiples of such a body.

These and further objects and advantages of the invention will be best understood in connection with the detailed description that follows of several embodiments of the invention, taken in conjunction with the accompanying drawings.

SUMMARY OF DRAWINGS

FIGS. 3A-C schematically illustrate various devices in accordance with the invention;

DETAILED DESCRIPTION OF PREFERRED EMBODIMENTS

For background material, reference is made to the attached Appendix, which lists a number of publications in this field. In addition, reference from time to time will be made to those published papers by a bracketed number for disclosure relevant to this application but which need not be repeated here, the contents of which are hereby incorporated by such references.

Figure 1:
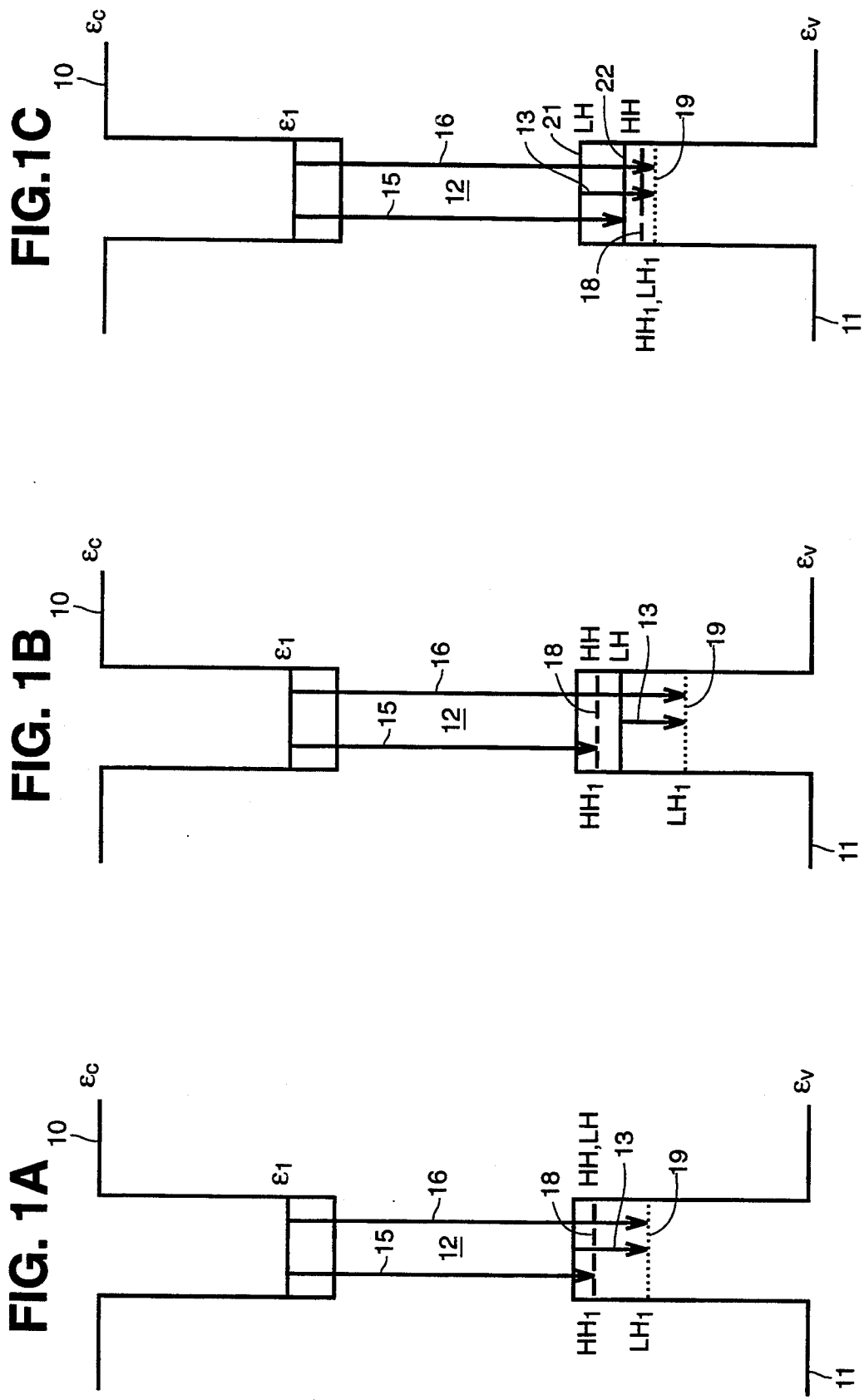
FIGS. 1A-C are schematic views of the energy band structures of a QW laser to explain principles underlying the invention.

As indicated above, quantum well (QW) lasers normally oscillate in the TE polarization, because the n=1 heavy hole transition is the fundamental (lowest energy) transition, as shown in FIG. 1. In FIG. 1, the upper set of lines 10 represent the lower bound of the conduction band, the lower set of lines 11 represents the upper bound of the valence band, and the forbidden bandgap is designated 12.

The notation used is:

HH=Heavy hole edge. A numerical subscript of 1 means that n=1, or the fundamental, lowest energy transition.

LH=Light hole edge, with the same meaning given to numerical subscripts.

$\epsilon_1$=Electron level 1 in the conduction band.

The transitions are indicated by arrows. As shown in FIG. 1a, the transition 15 from the electron level $\epsilon_1$ to $HH_1$ 18 is lower in energy than the corresponding transition 16 to $LH_1$ 19.

This is true for both unstrained GaAs/AlGaAs, and GaInP/AlGaInP, and compressively strained InGaAs/AlGaAs, InGaP/AlGaInP, and InGaAs/InGaAsP/InP QW lasers. In unstrained bulk material the HH and LH levels are degenerate at the band edge. However the quantum size effect in quantum wells shifts the LH farther from the band edge as shown in FIG. 1a because the quantum shifts, indicated by arrows 13, are inversely proportional to the effective mass; therefore the light hole levels are shifted to higher energies than the heavy hole levels. Additionally, in compressively stained InGaAs/AlGaAs, GaInP/AlGaInP, and InGaAs/InGaAsP lasers, the strain leads to an even greater split between these levels, as shown in FIG. 1b.

In a structure where the light hole and heavy hole band edges are reversed, however, such as can occur in a tensile-strained active region, lasing occurs in the TM polarization. This has been observed in tensile strained InGaAsP/InP QWs and in both bulk and QW devices in the GaInP/AlGaInP/GaAs material systems [2-5].

In accordance with this aspect of the invention, a device where the light-hole and heavy-hole bands are substantially coincident in energy, the polarization of the emission will be a sensitive function of the threshold carrier density (which determines the degree to which the individual band populations are inverted), and other factors such as temperature, facet reflectivity, cavity length, and intracavity loss. Such a device structure would allow either polarization to be selected, or switched. This is accomplished with a tensile-strained QW or multiple QWs, whose thickness is adjusted so that the LH and HH band edges line up substantially exactly. This condition is sometimes referred to as near-degeneracy at the band edge, at k=0. This normally means that the band edges are within a small fraction of one kT in energy of one another.

Shown in FIG. 1c is the band alignment which will allow both polarizations. In the valence band, tensile strain shifts the LH band edge 21 above that of the HH 22. Since the light holes undergo a greater quantum shift than the heavy holes, however, the light hole state is the lowest energy state only for bulk material or for thick wells. At the other extreme, for very thin wells, the heavy hole state can have lowest energy, because it is not quantum shifted to as high an energy as the light hole. Thus, there exists some intermediate thickness where the light hole and heavy hole band edges can line up exactly.

Figure 2:
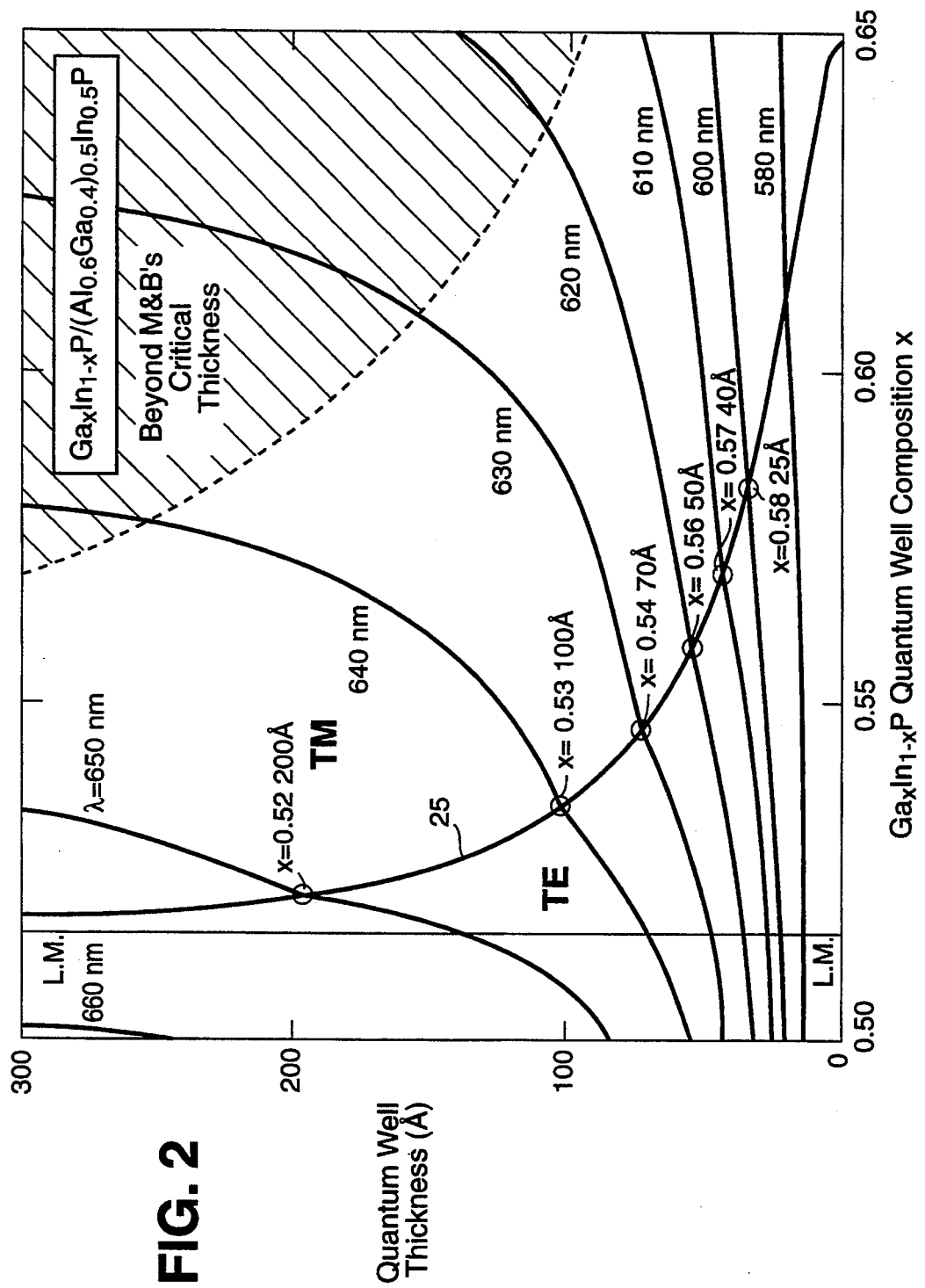
FIG. 2 is a graph plotting QW thickness v. QW composition illustrating TE/TM mode transitions.

Using parameters from Ref. [6] in a simple square-well potential model which includes the effect of strain [7], this crossover thickness is shown in FIG. 2 by the curve referenced 25, as a function of $Ga_xIn_{1-x}P$ QW composition, clad by lattice-matched $(Al_{0.6}Ga_{0.4})_{0.5}In_{0.5}P$; the lattice matched (to GaAs) alloy has X=0.516. While the exact crossover thickness is a sensitive function of the effective masses and band offsets, which may not be well documented, it is clear that there is an inverse relationship between the strain (which increases the LH-HH split) and the crossover thickness (which must be made thin to compensate).

For a diode laser with a QW of this appropriate thickness derived from FIG. 2, the resulting polarization could be either TE or TM, depending upon the gain anisotropy, and band-filling at threshold. For thicknesses greater than the crossover thickness represented by curve 25, TM polarization is observed [2,3,5], while for thicknesses less than the crossover thickness, TE polarization results. Near the crossover thickness, the band edges lie near each other in energy, and it is possible to select the higher energy band (if it has greater peak gain) by increasing the threshold current, so that bandfilling occurs. This effect has already been observed in DH AlGaInP lasers, where quantum shifts and gain anisotropy are insignificant and only very small strains are possible [4]. In a QW structure where the QW thickness is adjusted near this critical value, it will also be possible to obtain both polarizations.

Examples of QW thickness range from 20 Å–300 Å, and the value of X defining the composition of the ternary III–V compound are indicated in FIG. 2. Thus, if the QW thickness is 100Å in $Ga_{0.53}In_{0.47}P$, the diode will lase at 640 nm in either its TM or TE mode depending upon operating factors.

If multiple QWs are present, they are preferably separated by a distance of 20–200 Å.

using this critical structure, there are several ways of selectively achieving devices of both polarizations, shown in FIG. 3. First, with a long-cavity structure, where the (distributed) mirror loss becomes unimportant, the threshold current density is lowest and very little bandfilling occurs. In this case, the lowest energy transition should oscillate. As the threshold current density is increased by including loss, however, the valence bands begin to fill, so that the higher energy, higher gain transition can oscillate. Thus, while the TE-mode (heavy hole) or the TM-mode (light hole) may dominate for low-threshold current densities, the three possibilities shown in FIG. 3 all include some means of introducing loss into the cavity, to select the other polarization, which has a higher threshold carrier density but also higher gain.

For example, FIG. 3A shows a dual laser device 29 containing a long 30 and short-cavity 31 laser, which could be achieved on the same wafer by (chemically assisted) ion beam-etched facets. The short-cavity device on the right would have a higher threshold current density. Alternatively, FIG. 3B shows a dual laser device 29' with, an unpumped section 34 on the right laser 33 which can serve as an intracavity absorber, raising the threshold carrier density. If the device 33 on the right is separately contacted 34, this section 34 could be forward biased slightly below transparency, so that the polarization could be electrically, and rapidly switched. The section 34 thus acts as a loss modulator with a separate electrode for electronic polarization switching. Finally, FIG. 3C shows a dual laser device 35 with two pumped sections 36, one of which is pumped to its end while the other contains an unpumped section 38. The end section 38 is lossy (absorptive), producing a higher threshold current density in the left laser. These three examples demonstrate ways in which loss can be selectively introduced, to select the desired polarization from a single wafer with the TE-TM crossover layer structure.

Figure 4A:
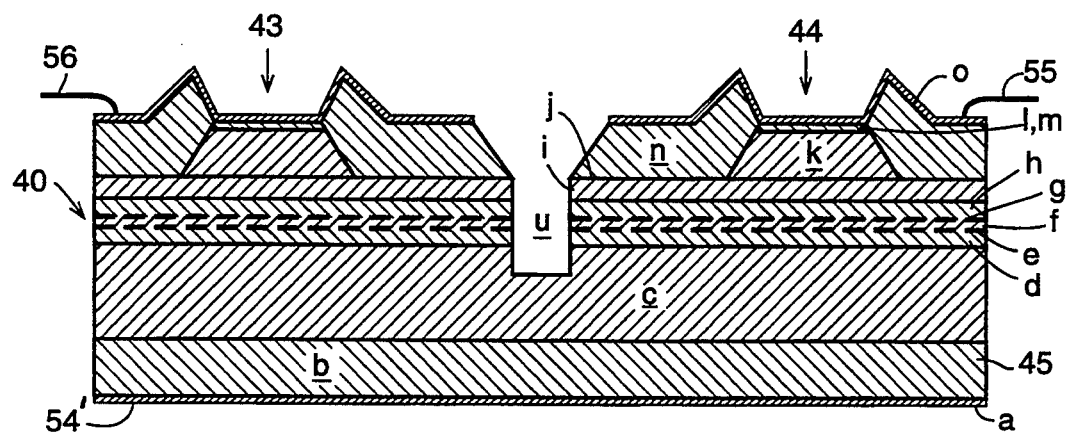
FIGS. 4A and 4B are, respectively, a cross-sectional and top views of one form of multiply-emitting QW laser in accordance with the invention.
Figure 4B:
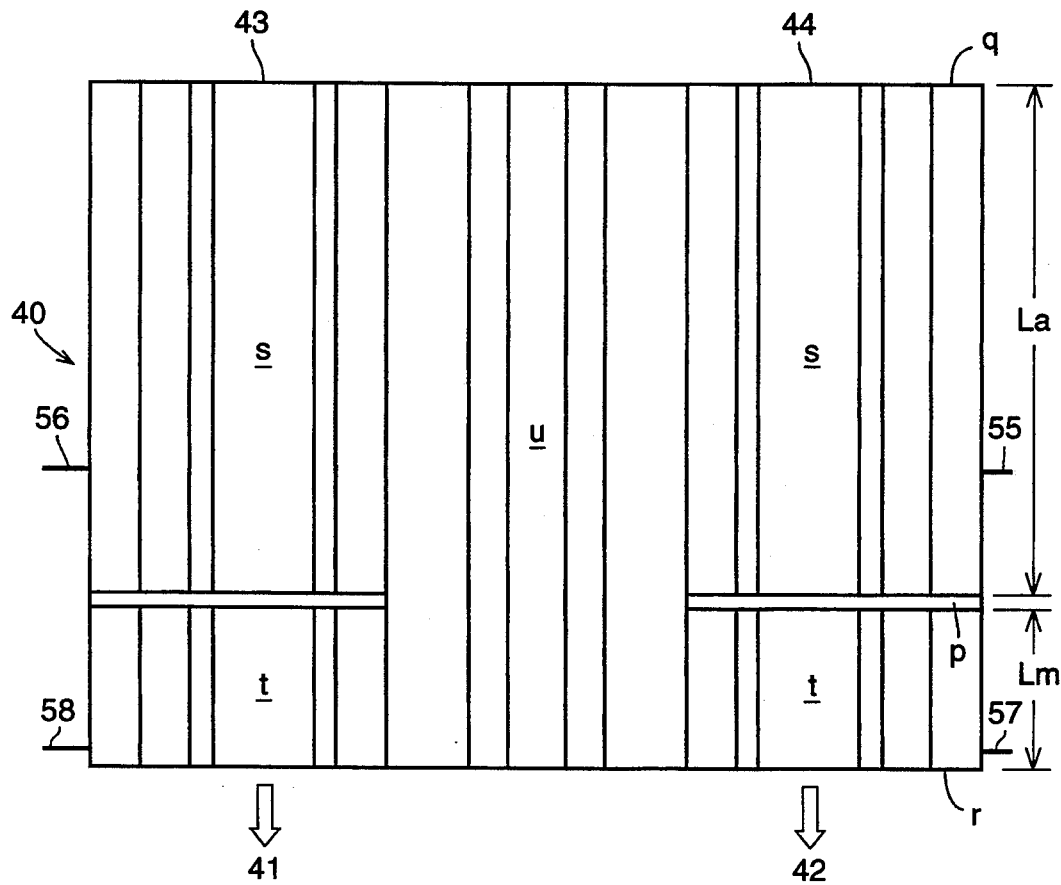

FIG. 4A shows one form of device, in cross-section, embodying the invention. FIG. 4B is a top view corresponding to the FIG. 3 schematic showings. The device comprises a laser structure 40 capable of emitting two laser beams 41, 42 closely spaced to one another and of the same or different polarizations from adjacently constructed laser diode 43,44 on the same substrate 45. In a practical use as a multi-beam light source, different polarizations would be employed to minimize optical interference or as a light source in multiple station/multiple position printers as described in concurrently filed application Ser. No. 07/948,531, patented Aug. 30, 1994, U.S. Pat. No. 5,343,224. The structure illustrated is described below with lower-case reference letters:

a: N-ohmic contact metal
b: N-type GaAs substrate
c: $(Al_xGa_{1-x})_{0.5}In_{0.5}P$ $(0.6 < X_{clad} < 1.0)$ N-cladding layer (0.6–1.5 μm)
d: $(Al_xGa_{1-x})_{0.5}In_{0.5}P$ $(0.2 < x_{SCH} < 0.6)$ lower confining layer (500–2000Å)
e: $Ga_zIn_{1-z}P$ quantum well(s) for TE-and TM-mode gain
f: $(Al_xGa_{1-x})_{0.5}In_{0.5}P$ $(0.2 < X_{BARRIER} < 0.6)$ barrier between quantum well (s) (20–200Å)
g: $Ga_zIn_{1-z}P$ quantum well(s) for TE-and TM-mode gain
h: $(Al_xGa_{1-x})_{0.5}In_{0.5}P$ $(0.2 < X_{SCH} < 0.6)$ upper confining layer (500–2000Å)
i: $(Al_xGa_{1-x})_{0.5}In_{0.5}P$ $(0.6 < X_{clad} < 1.0)$ P-cladding layer (0.1–0.3 μm)
j: $Ga_zIn_{1-z}P$ $(0.5 < Z_{ES} < 0.7)$ etch stop layer (20–100Å)
k: $(Al_xGa_{1-x})_{0.5}In_{0.5}P$ $(0.6 < X_{clad} < 1.0)$ or $Al_yGa_{1-y}As$ (y > 0.8) P-cladding layer (0.6–1.5 μm)
l: $(Al_xGa_{1-x})_{0.5}In_{0.5}P$ barrier reduction layer, graded or stepped from $X = X_{clad}$ to $X = 0$ (500–2000Å)
m: GaAs P+ cap layer (500–5000Å)
n: N-type GaAs burying layer; selectively regrown (0.2–2.0 μm)
o: P-ohmic contact metal
p: isolation groove between active and modulator sections
q: back-facet reflective coating
r: front-facet passivation coating
s: active section contact pad
t: modulator section contact pad
u: isolation groove to optically and electrically separate adjacent lasers While two QWs e and g are shown, it will be understood that the device structure of FIG. 4A can have a single QW, or more than one QW.

As a first approximation, the composition and thickness of the $Ga_zIn_{1-z}P$ QW or QWs e and g are determined by the wavelength desired, from the curve in FIG. 2.

| Desired wavelength | Z | $L_Z$ |
| --- | --- | --- |
| 650 nm | 0.52 | 200Å |
| 640 | 0.53 | 100Å |
| 630 | 0.54 | 70Å |
| 620 | 0.56 | 50Å |
| 610 | 0.57 | 40Å |
| 600 | 0.58 | 25Å |

The gain-current characteristics of the light-and heavy-hole bands are also important in more precisely determining the QW parameters (thickness and composition). As these are complicated and can not be predicted accurately, the ultimate structure can be experimentally modified to achieve the desired wavelength.

The polarization control of the FIG. 4A device works as follows:

The structure is adjusted so that one polarization has a lower threshold current, while the other polarization has a higher peak gain (at some elevated current density.)

Figure 5:
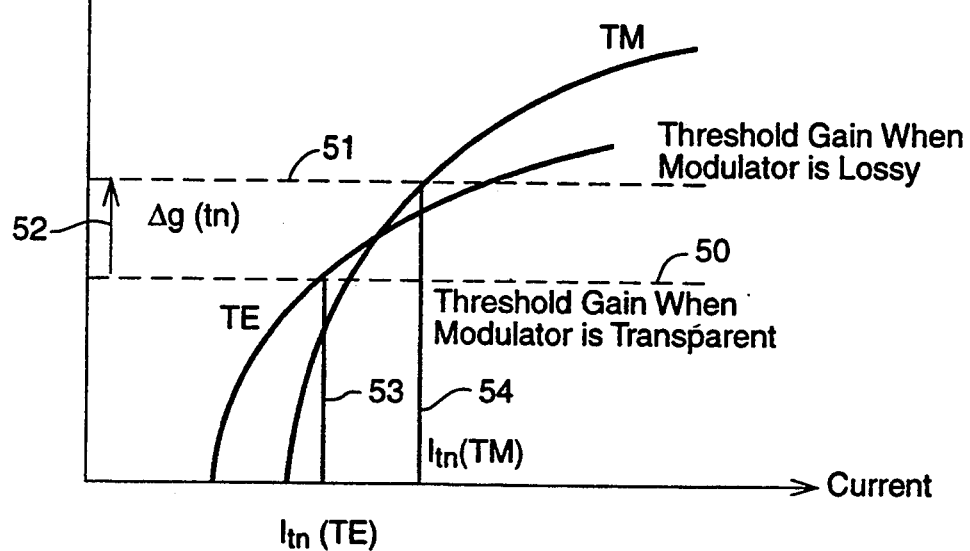
FIG. 5 is a graph illustrating how to control the desired polarization mode.

The graph of FIG. 5 illustrates an example of the desired TE- and TM-mode gain-current relationship. Modal gain is plotted as a function of device current, for both the TM and TE modes. The lower dashed line 50 represents, for example, the threshold gain of the device 41 with modulator section t when it is biased to optical transparency. The upper dashed line 51 illustrates the case when the modulator section t is operated so it introduces optical loss, for example, biased below transparency, or simply unbiased. The arrow 52 indicates the threshold gain difference Δg. The vertical line 53 indicates the lower threshold current that will cause the laser to emit in the TE mode, and the vertical line 54 indicates the higher threshold current that will switch the laser to the TM mode. So, for this example, which is not intended to be limiting, the TE mode has a lower transparency current, while the TM mode has the greater gain. This, as one embodiment of the invention, is taken advantage of to control the polarization mode. This can be implemented as follows:

When the modulator section t is left unbiased, or when biased below the transparency current density, it is optically absorptive introducing loss. This condition raises the threshold gain, as shown at 51 in FIG. 5. The threshold gain ($g_{th}$) is:

$$g_{th} = \alpha_a + \frac{1}{L_a} \ln \frac{1}{\sqrt{R_f R_r}} + \frac{L_m}{L_a} \alpha_m$$

where $\alpha_a$ = distributed loss in active laser cavity
$R_{f(r)}$ = front (rear) facet reflectivities
$L_{m(a)}$ = length of modulator (active laser) cavities
$\alpha_m$ = modal absorption loss in modulator section However, when the modulator section t is sufficiently forward biased to transparency ($\alpha_m = 0$), the threshold gain is simply that for a laser without any modulator section shown at 50 in FIG. 5 (i.e., the last term disappears in the equation above). When biased even further to provide optical gain ($\alpha_m < 0$), the threshold gain is further reduced. When the modulator is unbiased, reverse biased, or sub-transparency forward biased, it is lossy ($\alpha_m > 0$) and the threshold gain is increased. Thus, the modulator section t can be used to change the intracavity loss, and with the appropriate gain-current-polarization characteristics it will also change the polarization.

The overall cavity's length, indicated by $L_a$ in FIG. 4B, is chosen so that the lower threshold mode (the TE-mode in FIG. 5) will oscillate first when the modulator section is biased to transparency (If the cavity length $L_a$ is too short, only the higher-gain mode will oscillate). The length $L_m$ and bias of the modulator section t are chosen such that when its current is reduced below transparency, the threshold gain increases enough that the other polarization (with higher peak gain) will oscillate.

With this structure, then, the low threshold mode oscillates when the modulator t is forward-biased to transparency or for positive gain. When the modular bias is reduced so that it becomes sufficiently optically absorptive, the higher-gain mode will oscillate. In the device 40 shown on FIG. 4A, both lasers 43, 44 can be dynamically switched between the TE- and TM-mode oscillation.

It will be understood that FIG. 5 is only one example of the TE-and TM-mode gain-current relationship. Other structures or compositions may exhibit variations of the FIG. 5 curves, though the underlying principles will be the same.

Figure 6:
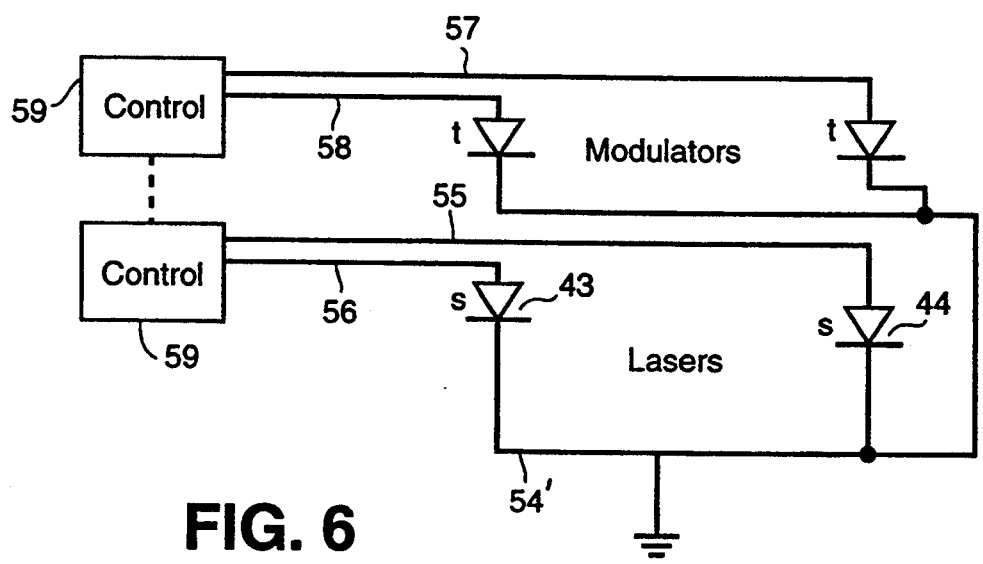
FIG. 6 is one form of a circuit schematic for operating the device of FIG. 4.

FIG. 6 illustrates one form of circuitry for electronically controlling the polarization of the two diodes. The diodes are referenced s, the modulator sections are referenced t, as in FIG. 4A. The lead connections to the substrate contact a, top contacts o and modulator sections t are designated 54', 55, 56, 57, and 58, respectively, in FIG. 4A. Controllers 59 control the operation by determining when each diode 43, 44 will fire, simultaneously or alternatively, and the electronic signals to the modulator sections t from the controllers 59 determine their biased states and therefore whether they behave optically transparent or optically absorbent. Within a limited range of modulation biases, the modulator sections alone can be used to switch the lasers on and off.

In the embodiment described in connection with FIG. 4A, the incorporation of a degenerate QW in each laser 43, 44 enables the polarization of either to be selectively controlled by, for example, the biasing circuit of FIG. 6.

Figure 7:
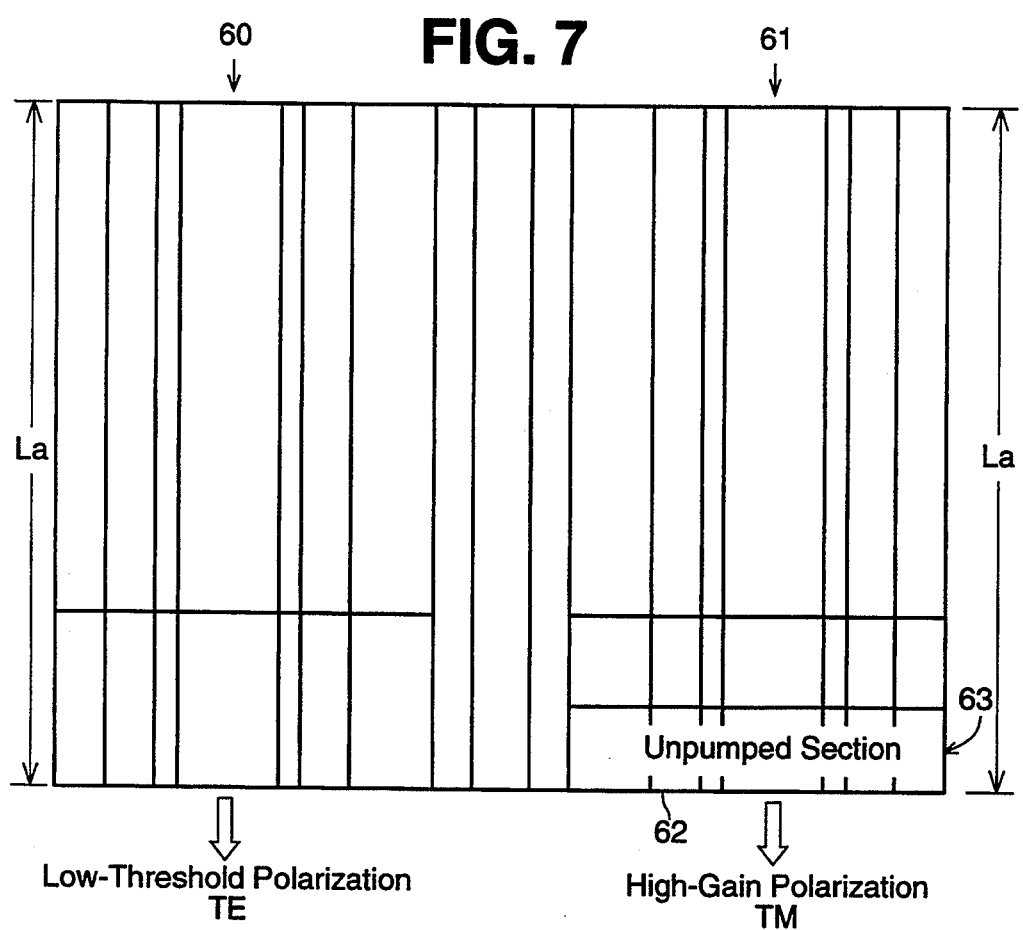
FIG. 7 shows another laser construction in accordance with the invention with fixed polarization modes.

FIG. 7 illustrates another embodiment of the invention, in a view from the top, with adjacent diodes 60,61, both of the same length of cavity $L_a$, but the diode 61 on the right with a contact-free area 62 serving as an unpumped section 63. This makes a device where each laser 60, 61 can operate in a fixed (unswitchable) polarization, and the unpumped section 63 of the device 61 can serve as a loss which drives the device into the high-gain TM polarization mode. In this case, the cavity length, $L_a$ is chosen so that the low threshold TE mode normally oscillates, as in the device 60 on the left. The adjacent (right-hand side) laser 61 contains the unpumped section along the cavity, which increases the threshold gain requirement to a level above where the TE- and TM-mode gain-current curves crossover (FIG. 5). Thus, only the polarization with the higher-modal gain will oscillate for this case of a lossy cavity. Because of bandfilling, the lasers when operated in the TE or TM modes may not have exactly the same wavelength. In this embodiment of the invention, the switchable polarization is obtained by selectively activating either the left laser 60 to emit in the TE mode or the right laser 61 to emit in the TM mode. The circuit of FIG. 6 can readily be modified to provide the desired polarization switching action.

As a further alternative, one active region can be tensile-strained for TM mode operation, and the other active region compressive-strained for TE mode operation.

It will be clearly understood that the invention is not limited to the examples given, which illustrate various ways to construct QW laser diodes whose polarization mode is controllable electronically or physically, so that multiple such diodes can be mounted side-by-side to alternately generate TE or TM mode emissions. Nor, as will be evident is the invention limited to the specific geometry or compositions of the examples given. The references cited in the Appendix provide many more examples of compositions and geometries suitable for use in the invention as will be evident to those skilled in this art. For example, the thickness and composition of the QWs are most important in determining the gain-current characteristic in each polarization.

While a preferred embodiment of the invention includes a semiconductor material with a single QW, in one or plural diodes, whose composition and thickness fall approximately on the curve 25 of FIG. 2, it will be understood that each or both diodes can have separate QWs as described in the copending related case, Ser. No. 07/948,524. In this latter case, the switching of the polarization could be implemented by controlling threshold current, absorption losses, etc. as described here and in the related case to activate selectively one or the other QW in each diode to generate radiation beams in the desired TE- or TM-polarization.

Figure 8:
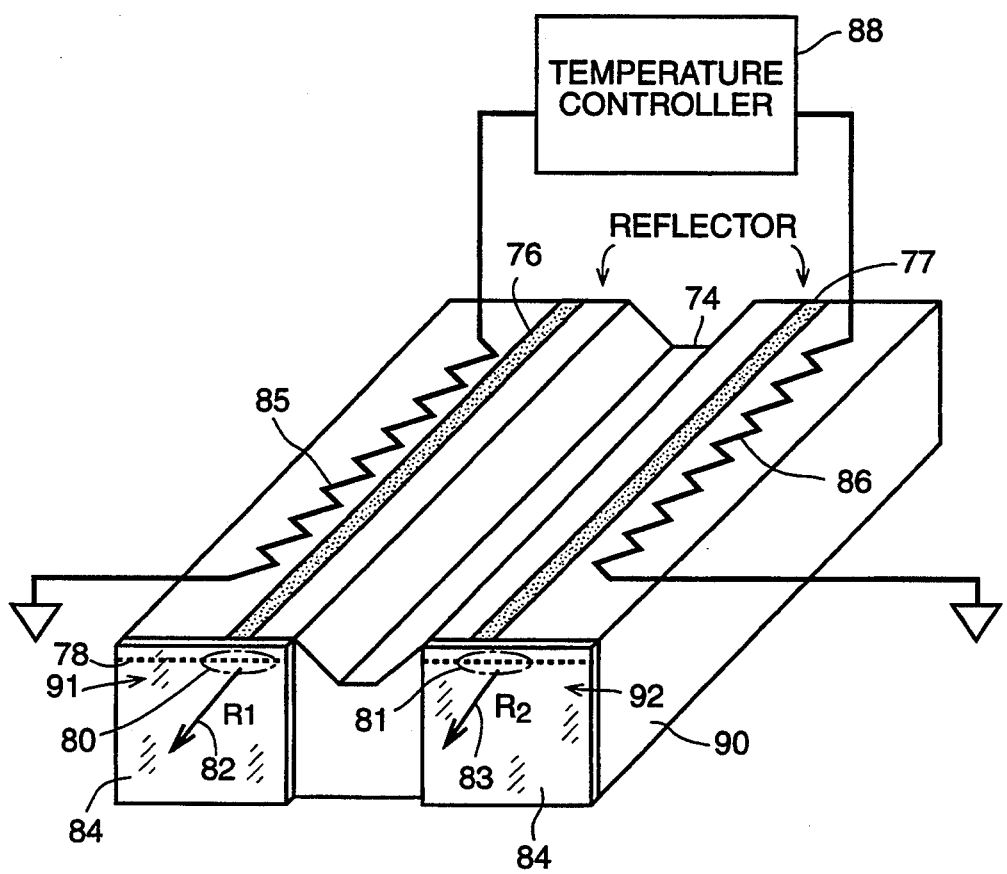
FIG. 8 shows another laser construction in accordance with the invention for selectively controlling the polarization modes.

FIG. 8 shows an embodiment of the invention in which in a common substrate 70 are built two side-by-side diode laser structures 71, 72 electrically isolated from each other. Stripe contacts 76, 77 are shown on top. The contact at the bottom is not shown. The active laser region is indicated by the dotted line 78, and thus the left laser 71 will emit from the region 80 in the forward direction indicated by arrow 82, whereas the right laser 72 will emit from the region 81 in the direction 83, through slightly transparent front reflectors 84, 84'. The back reflectors are fully reflective. Deposited heater elements 85, 86 are provided on each laser, and their current is controlled by a temperature controller 88.

Providing temporary surges or pulses of current selectively to the heaters 85, 86 should enable the temperature of the underlying laser to be selectively controlled. A higher temperature alters the TE- and TM-mode gain-current characteristics, and requires a higher threshold current which could produce the TM-mode. By controlling the current through the respective heaters, so that, for example, the temperature T1 of the left laser 71 is higher than the temperature T2 of the right laser 72, then the left laser will have a higher threshold and operate in the TM mode, while the right laser with the lower threshold current will operate in the TE mode.

FIG. 8 also illustrates that the reflectivity of the body front reflectors 84, 84' can be controlled to produce different modes. If the reflectivity $R_1$ at the front facet 84 is high, the laser 71 has a low threshold and will operate in the TE mode. If the reflectivity $R_2$ at 84' is lower than $R_1$, then the laser 72 has a higher threshold and higher gain mode and will operate in the TM mode. The way to control facet reflectivity is described in detail in reference [9]. Hence, in the FIG. 8 embodiment, if $R_2 < R_1$, the left laser 71 can be operated in the TE mode and the right laser 72 in the TM mode.

Material preparation, and diode fabrication are described in detail in references [10] and [11].

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

What is claimed is:

1. A polarization-switchable QW semiconductor laser, comprising:
   (a) a semiconductor body having one or more active portions of a material exhibiting heavy hole and light hole energy band edges and capable of lasing and providing TE-mode polarized gain from heavy hole band transitions and TM-mode polarized gain from light hole band transitions,
   (b) said active portions being constructed such that the heavy hole and light hole band edges substantially line up,
   (c) electrodes for introducing carriers into the active body portions,
   (d) optical reflectors associated with the active body portions,
   (e) means to cause the laser to selectively lase in either its TE-mode or its TM-mode in response to changing its threshold carrier density.

2. A polarization-switchable multi-emitting QW semiconductor laser, comprising:
   (a) a semiconductor body having at least one active portion of a material exhibiting heavy hole and light hole forbidden band defined by energy band edges and capable of lasing and providing TE-mode polarized gain from heavy hole band transitions and TM-mode polarized gain from light hole band transitions,
   (b) said active portion being tensile-strained and having a thickness and composition such that the heavy hole and light hole band edges substantially line up,
   (c) electrodes for introducing carriers into the active body portion,
   (d) optical reflectors associated with the active body portion,
   (e) means for selectively switching the semiconductor body active portion to lase in either its TE-mode or its TM-mode by changing its threshold gain or temperature.

3. A polarization-switchable multi-emitting QW semiconductor laser, comprising:
   (a) a semiconductor body having at least one active portion of a material exhibiting heavy hole and light hole forbidden band defined by energy band edges and capable of lasing and providing TE-mode polarized gain from heavy hole band transitions and TM-mode polarized gain from light hole band transitions,
   (b) said active portion being tensile-strained and having a thickness and composition such that the heavy hole and light hole band edges substantially line up,
   (c) electrodes for introducing carriers into the active body portion,
   (d) optical reflectors associated with the active body portion,
   (e) means for selectively switching the semiconductor body active portion to lase in either its TE-mode or its TM-mode, said means for selectively switching comprising means for changing the threshold gain and carrier density of the active portion.

4. The laser of claim 3, wherein the means for changing the threshold carrier density comprises means for changing the temperature of the active portion.

5. The laser of claim 3, wherein the means for changing the threshold carrier density comprises means for selectively introducing loss into the active portion.

6. The laser of claim 3, wherein the means for changing the threshold carrier density comprises means for altering the reflectivity of the optical reflectors.

7. A polarization-switchable QW semiconductor laser, comprising:
   (a) a semiconductor body having one or more active portions of a material exhibiting heavy hole and light hole band edges and capable of lasing and providing TE-mode polarized gain from heavy hole band transitions and TM-mode polarized gain from light hole band transitions,
   (b) said active portions being tensile-strain-induced near degeneracy of the heavy hole and light hole band edges, (c) electrodes for introducing carriers into the active body portions,
(d) optical reflectors associated with the active body portions,
(e) means for introducing a controlled loss into an active portion in order to cause the active body portion to lase in its TE or TM-polarization mode.

8. The laser of claim 7, wherein the semiconductor active portion comprises a GaInP/AlGaInP/GaAs QW structure.

9. The laser of claim 7, wherein the semiconductor active portion comprises a GaAsP/AlGaAs QW structure.

10. The laser of claim 7, wherein the semiconductor active portion comprises an InGaAs/InGaAsP/InP QW structure.

11. The laser of claim 7, wherein the active portion comprises a quantum well having a thickness and composition such that the light hole and heavy hole band edges substantially line up.

12. A polarization-switchable QW semiconductor laser, comprising:
(a) a semiconductor body having one or more active portions of a material exhibiting heavy hole and light hole band edges and capable of lasing and providing TE-mode polarized gain from heavy hole band transitions and TM-mode polarized gain from light hole band transitions,
(b) said active portions being tensile-strain-induced near degeneracy of the heavy hole and light hole band edges,
(c) electrodes for introducing carriers into the active body portions,
(d) optical reflectors associated with the active body portions,
(e) means for introducing a controlled loss into an active portion in order to cause the active body portion to lase in its TE or TM-polarization mode, said means for introducing a controlled loss comprising an intra cavity loss modulator.

13. The laser of claim 12, wherein the means for introducing a controlled loss comprises, in the semiconductor body, an unpumped section serving as an intracavity absorber.

14. A polarization-switchable multi-emitting semiconductor laser, comprising:
(a) a semiconductor body having an active portion of a material exhibiting heavy hole and light hole band edges and capable of lasing and providing TE-mode polarized gain from heavy hole band transitions and TM-mode polarized gain from light hole band transitions,
(b) said active portion being constructed such that the heavy hole and light hole band edges substantially line up,
(c) adjacent QW laser structures in said active portion,
(d) electrodes for introducing carriers into the adjacent laser structures,
(e) optical reflectors associated with each laser structure,
(f) means connected to the adjacent laser structures for causing each selectively to lase in either its TE-mode or its TM-mode.

15. The laser of claim 14, wherein the means for selectively causing each to lase comprises means for changing the threshold gain, and current density.

16. The laser of claim 14, wherein each laser structure comprises a cavity section and a modulator section, further comprising means for biasing the modulator section to exhibit transparent or absorbent behaviour.

17. The laser of claim 16, wherein one laser is configured to have low-threshold polarization, and the other laser is configured to have high gain polarization.

18. The laser of claim 17, wherein said other laser has an unpumped section.

19. A polarization switchable emitting semiconductor QW laser, comprising:
(a) a semiconductor body having first and second side-by-side active portions of the same material exhibiting heavy hole and light hole band edges and capable of lasing and providing TE-mode polarized gain from heavy hole band transitions and TM-mode polarized gain from light hole band transitions, said first and second active portions forming adjacent first and second QW laser structures emitting, respectively, in the TE-mode and TM-mode,
(b) electrodes for introducing carriers into the active portions,
(c) optical reflectors associated with each laser structure,
(d) means connected to the adjacent laser structures for selectively activating same causing the first to lase in its TE-mode and the second to lase in its TM-mode.

20. The laser of claim 19, wherein the active portions are parts of a common active region.

21. The laser of claim 19, wherein each active portion comprises the same multiple QWs of which a QW in the first laser is adapted for TE-mode gain and a QW in the second laser is adapted for TM-mode gain.

22. The laser of claim 21, wherein the means of claim element (d) comprises means for activating the QW in the first laser structure and means for activating the QW in the second laser structure.

23. A polarization-switchable semiconductor laser, comprising:
(a) a semiconductor body having a strained active portion of GaInP exhibiting heavy hole and light hole band edges and capable of lasing and providing TE-mode polarized gain from heavy hole band transitions and TM-mode polarized gain from light hole band transitions, said active portion being flanked by claddings of AlGaInP,
(b) a QW laser structure in said active portion,
(c) electrodes for introducing carriers into the laser structure,
(d) optical reflectors associated with the laser structure,
(e) means connected to the laser structure for causing it selectively to lase in either its TE-mode or its TM-mode by changing its threshold gain or temperature.

24. A polarization switchable emitting semiconductor QW laser, comprising:
(a) a semiconductor body having first and second side-by-side active portions of a material exhibiting heavy hole and light hole band edges and capable of lasing and providing TE-mode polarized gain from heavy hole band transitions and TM-mode polarized gain from light hole band transitions, said first and second active portions forming adjacent first and second QW laser structures emitting, respectively, in the TE-mode and TM-mode, each laser structure comprising the same QW having the same thickness and composition, (b) electrodes for introducing carriers into the active portions, (c) optical reflectors associated with each laser structure, (d) means connected to the adjacent laser structures for selectively activating same causing the first to lase in its TE-mode and the second to lase in its TM-mode.

25. A polarization-switchable semiconductor laser, comprising (a) a semiconductor body having an active portion of a material exhibiting heavy hole and light hole band edges and capable of lasing and providing TE-mode polarized gain from heavy hole band transitions and TM-mode polarized gain from light hole band transitions, (b) a QW laser structure having a single QW for which the heavy hole and light hole band edges substantially line up in said active portion, (c) electrodes for introducing carriers into the laser structure, (d) optical reflectors associated with the laser structure, (e) means connected to the laser structure for causing it selectively to lase in either its TE-mode or its TM-mode, said means for selectively causing it to lase comprises means for changing the threshold gain and current density.

26. A polarization-switchable semiconductor laser, comprising:

(a) a semiconductor body having an active portion of a material exhibiting heavy hole and light hole band edges and capable of lasing and providing TE-mode polarized gain from heavy hole band transitions and TM-mode polarized gain from light hole band transitions, (b) a QW laser structure having separate QWs providing respectively TE-mode gain and TM-mode gain in said active portion, (c) electrodes for introducing carriers into the laser structure, (d) optical reflectors associated with the laser structure, (e) means connected to the laser structure for causing it selectively to lase in either its TE-mode or its TM-mode.

27. A polarization-switchable semiconductor laser, comprising:

(a) a semiconductor body having an active portion of a material exhibiting heavy hole and light hole band edges and capable of lasing and providing TE-mode polarized gain from heavy hole band transitions and TM-mode polarized gain from light hole band transitions, (b) a QW laser structure comprising separate Qws in said active portion, (c) electrodes for introducing carriers into the laser structure, (d) optical reflectors associated with the laser structure, (e) means connected to the laser structure for causing it selectively to lase in either its TE-mode or its TM-mode, the means for selectively causing it to lase comprising means for selectively activating one or the other of the separate QWs.

28. A polarization-switchable QW semiconductor laser, comprising:

(a) a semiconductor body having one or more active portions of a material exhibiting heavy hole and light hole band edges and capable of lasing and providing TE-mode polarized gain from heavy hole band transitions and TM-mode polarized gain from light hole band transitions, (b) said active portion being tensile-strain-induced near degeneracy of the heavy hole and light hole band edges, said active portion comprising a quantum well having a thickness related to its composition to give substantial alignment between the heavy hole and light hole valence band edges, (c) electrodes for introducing carriers into the active body portions, (d) optical reflectors associated with the active body portions, (e) means for introducing a controlled loss into an active portion in order to cause the active body portion to lase in its TE or TM-polarization mode.

29. A polarization-switchable QW semiconductor laser, comprising:

(a) a semiconductor body having one or more active portions of a material exhibiting heavy hole and light hole band edges and capable of lasing and providing TE-mode polarized gain from heavy hole band transitions and TM-mode polarized gain from light hole band transitions, (b) said active portions being tensile-strain-induced near degeneracy of the heavy hole and light hole band edges, said active portion comprising a quantum well having a thickness in the range of about 20–300 Å.

(c) electrodes for introducing carriers into the active body portions, (d) optical reflectors associated with the active body portions, (e) means for introducing a controlled loss into an active portion in order to cause the active body portion to lase in its TE or TM-polarization mode.

* * * * *